United States Patent [19]
Hakey et al.

[11] Patent Number: 5,953,607
[45] Date of Patent: Sep. 14, 1999

[54] BURIED STRAP FOR TRENCH STORAGE CAPACITORS IN DRAM TRENCH CELLS

[75] Inventors: Mark C. Hakey, Milton; David V. Horak, Essex Junction, both of Vt.; Jack A. Mandelman, Stormville, N.Y.; Wendell P. Noble, Milton, Vt.

[73] Assignee: International Business Machines Corporation, Armonk, N.Y.

[21] Appl. No.: 08/870,336

[22] Filed: Jun. 6, 1997

[51] Int. Cl.⁶ .................................. H01L 21/8242
[52] U.S. Cl. ............... 438/249; 438/246; 438/248; 438/389; 438/392
[58] Field of Search ................... 438/246, 248, 438/249, 389, 392

[56] References Cited

U.S. PATENT DOCUMENTS

| | | | |
|---|---|---|---|
| 4,801,988 | 1/1989 | Kenney . | |
| 5,360,758 | 11/1994 | Bronner et al. | 438/243 |
| 5,389,559 | 2/1995 | Hsieh et al. | 438/243 |
| 5,395,786 | 3/1995 | Hsu et al. | 438/248 |
| 5,545,583 | 8/1996 | Lam et al. . | |
| 5,576,566 | 11/1996 | Kenney et al. . | |
| 5,627,092 | 5/1997 | Alsmeier et al. | 438/152 |
| 5,658,816 | 8/1997 | Rajeevakumar | 438/386 |
| 5,692,281 | 12/1997 | Rajeevakumar | 29/25.42 |

Primary Examiner—John F. Niebling
Assistant Examiner—John Murphy
Attorney, Agent, or Firm—Whitham, Curtis & Whitham; Howard J. Walter, Jr.

[57] ABSTRACT

A dynamic random access memory (DRAM) cell is formed with a buried strap which is routed through an isolation trench. This structure frees space in the transfer gate such that the location of the buried strap is not a limiting factor for decreasing the size of DRAM cells.

10 Claims, 8 Drawing Sheets

BURIED STRAP FOR TRENCH STORAGE CAPACITORS IN DRAM TRENCH CELLS

BACKGROUND OF THE INVENTION

1. Field of the Invention

The present invention generally relates to integrated circuit dynamic random access memories, and more particularly to trench capacitor construction.

2. Background Description

In dynamic random access memory (DRAM) evolution, reduction in cell area is critical to the development of the next generation and insuring an early cost cross-over. Currently, there are many types of DRAM cells. In the one Giga bit arena demands on capacitance area are great. In addition, DRAM trench cells having transfer device regions bound by deep trenches lend themselves more readily to sub 8 square layout than DRAM trench cells having transfer device regions surrounded by shallow trench isolation oxide.

DRAM trench cells having transfer device regions bound by deep trenches have challenges associated with the strapping capacitor to array device source, which is currently done with a surface strap. Overlay and image size are critical to yield and the strap takes up significant area interfering with array transfer device channel length and preventing the cell from further shrinkage.

SUMMARY OF THE INVENTION

It is an object of the present invention to provide a buried strap structure which uses less cell area and allows longer device transfer gate length.

In the present invention, the strap is a buried strap which is placed in an underutilized area in the isolation trench. The strap connects the inside of the storage trench to the backside of the array transfer device. The inventive strap is located in a region currently used for isolation only. Now, this region can have a dual purpose.

The inventive buried strap formation method begins with a dynamic random access memory (DRAM) cell array prepared with deep trenches. An isolation trench is cut through deep trench collar oxide, filled with oxide and planarized. A mask is used to etch an opening in the isolation oxide fill at the location for the buried strap. The etch is borderless to all but isolation trench oxide. Doped polysilicon fills this opening. A drive-in anneal is then used to drive dopant into the single crystal silicon and form the source of the DRAM array transfer device. Then a recess etch of the doped polysilicon is performed and a quick oxidation is performed to remove residual polysilicon. Silicon dioxide is added to fill the recess, and the structure is then planarized.

In the current surface strap processing methods, overlay and image control are important to yield. By contrast, in the inventive process, the isolation trench always stays in the deep trench collar and contact to the next diffusion does not occur. This reduces the constraints needed in processing. The channel length is greatly increased because the entire area taken up by the previous surface strap is now available for either channel lengthening or cell shrinkage. The inventive buried strap can be integrated into the 1 Gbit cell to yield about a 6.2 lithographic square cell. Because of the increase in channel length and position of the buried strap, the possibility to further shrink cell size exists.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 1A:
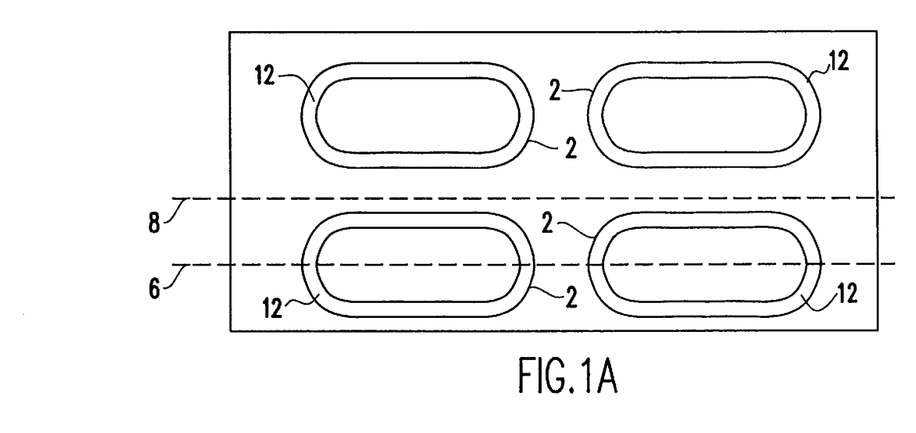
FIGS. 1A, 1B and 1C are respectively a top view and two cross sectional views of the device at the start of the inventive method.

Referring now to the drawings, and more particularly to FIGS. 1A through 7C, there are shown the steps of the inventive method for forming a buried strap for trench storage capacitors in dynamic random access memory (DRAM) trench cells. FIGS. 1 through 7 show consecutive steps in strap formation. Each figure shows a top view and two cross sectional views. FIG. 1A is a top view of a portion of a DRAM cell array prior to isolation trench formation, showing outlines of deep trenches 2 and collars 12. Dashed line 6 shows the cut for the cross section shown in FIG. 1B and dashed line 8 shows the cut for the cross section shown in FIG. 1C. Since FIGS. 1 through 7 represent steps in the formation of the strap, reference numerals will be used consecutively and interchangeably to represent the same structures in each of the figures.

Figure 1B:
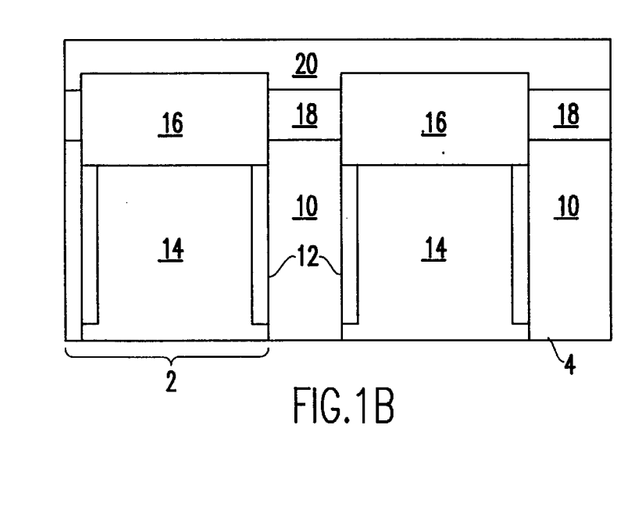

In the cross section shown in FIG. 1B, there is shown two of the deep trenches 2 shown in FIG. 1A, formed in lightly doped silicon substrate 10 and having collar 12 which can be silicon dioxide or other suitable materials. Deep trenches 2 are filled with doped polysilicon 14 and have an oxide cap 16. A transfer gate polysilicon layer 18 surrounds the oxide cap 16, and the device is covered with a layer of pad nitride 20.

Figure 1C:
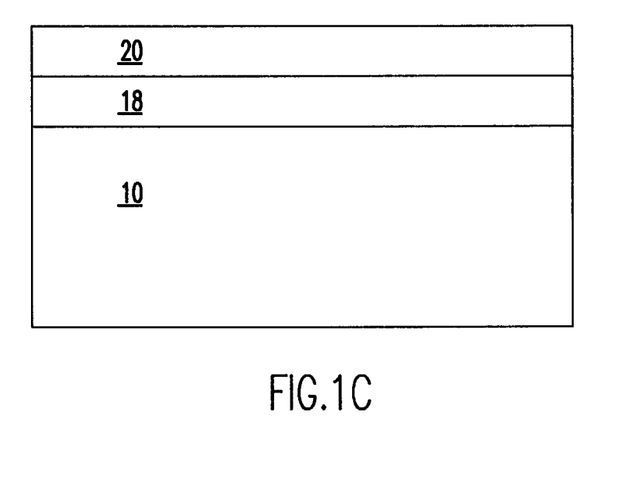

The cross section shown in FIG. 1C, is taken from a portion of the device which does not contain the deep trenches 2, only silicon substrate 10, the transfer gate polysilicon layer 18, and nitride 20 are shown.

Figure 2A:
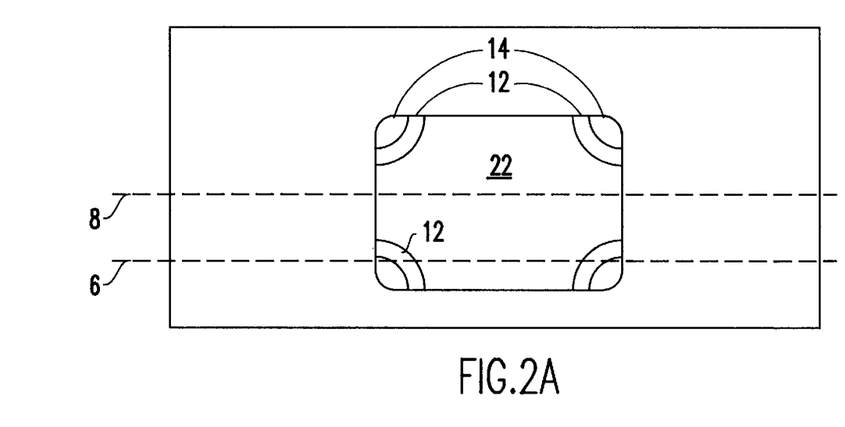
FIGS. 2A, 2B, and 2C are respectively a top view and two cross sectional views of the device shown in FIG. 1 after isolation trench etching.
Figure 2B:
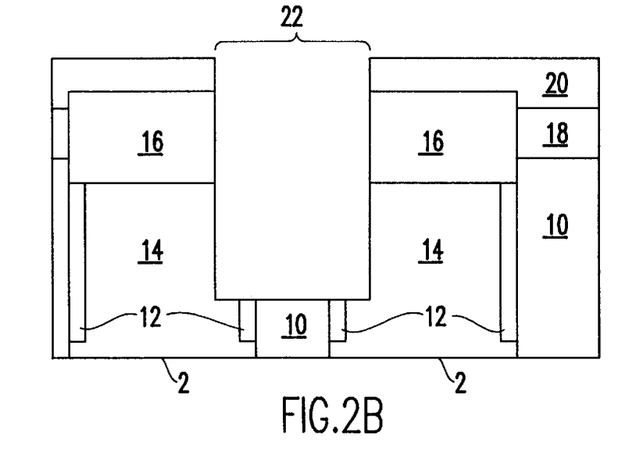
Figure 2C:
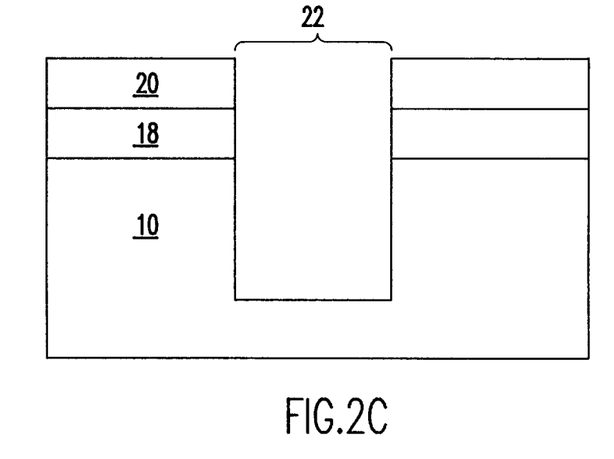

FIGS. 2A to 2C show the device following etching of the isolation trench. FIG. 2A shows isolation trench 22 which has been etched into the silicon substrate 10 through the pad nitride 20, the oxide cap 16 of a portion of four adjacent trenches, and the transfer gate polysilicon layer 18 positioned between the oxide cap 16 regions. In the corners of this isolation trench 22 are polysilicon 14 and collar 12 which filled the deep trenches 2 as described above. The full outlines of these deep trenches 2 are not shown here as they were previously shown in FIG. 1A. However, FIG. 2A shows the isolation trench etching exposed parts of each of the four deep trenches shown previously.

In the cross section shown in FIG. 2B, the isolation trench 22 is shown. This cross section shows the isolation trench 22 cutting through two deep trenches 2 in the plane represented. FIG. 2C shows the isolation trench 22 in the silicon substrate 10.

Figure 3A:
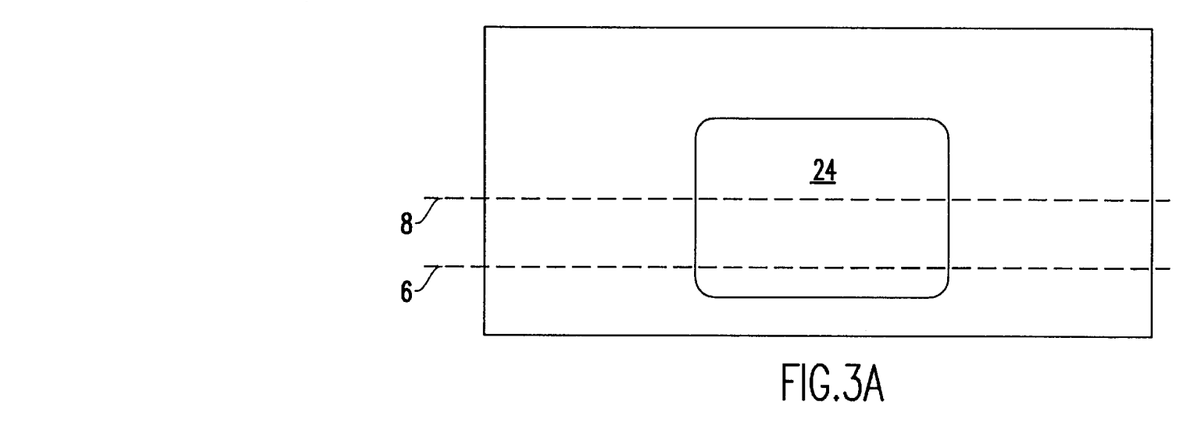
FIGS. 3A, 3B, and 3C are respectively a top view and two cross sectional views of the device shown in FIG. 2, following isolation trench fill with oxide.
Figure 3B:
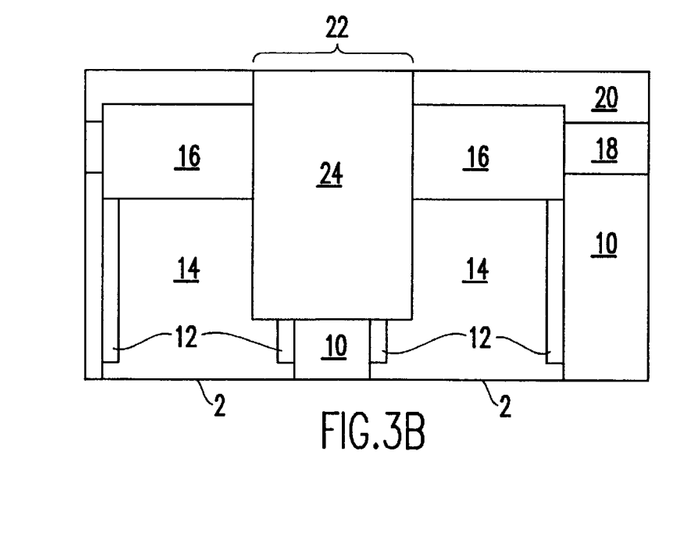
Figure 3C:
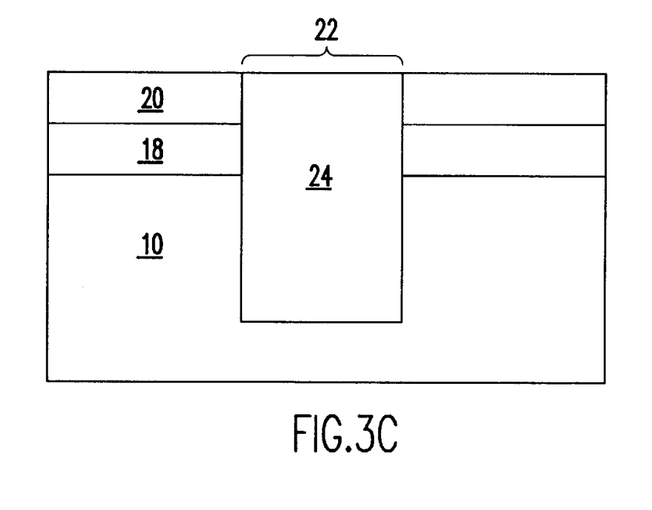

After the isolation trench is etched, the next step is to fill the trench with oxide, such as silicon dioxide, by chemical vapor deposition or by other suitable means. After oxide fill, the structure is planarized. FIGS. 3A, 3B, and 3C show the isolation trench 22 filled with oxide 24.

Figure 4A:
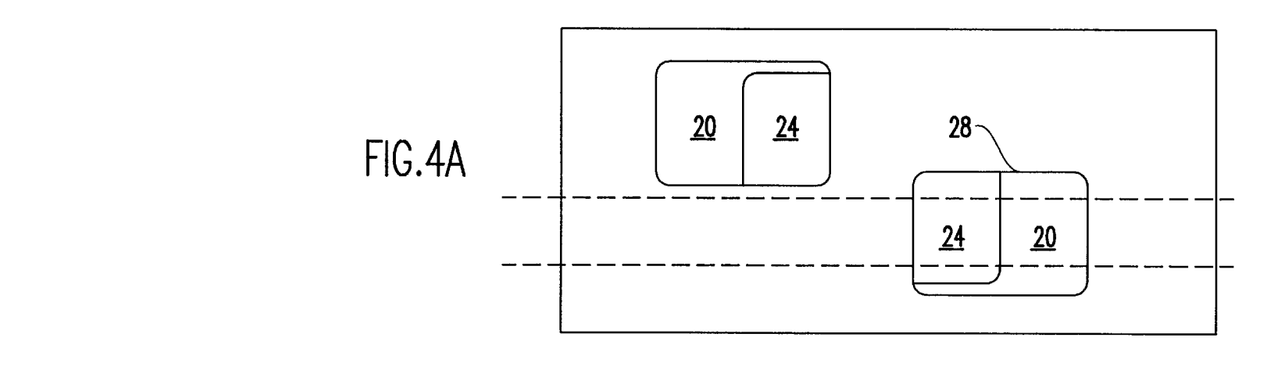
FIGS. 4A, 4B, and 4C are respectively a top view and two cross sectional views of the device shown in FIG. 3, following mask and oxide etch.
Figure 4B:
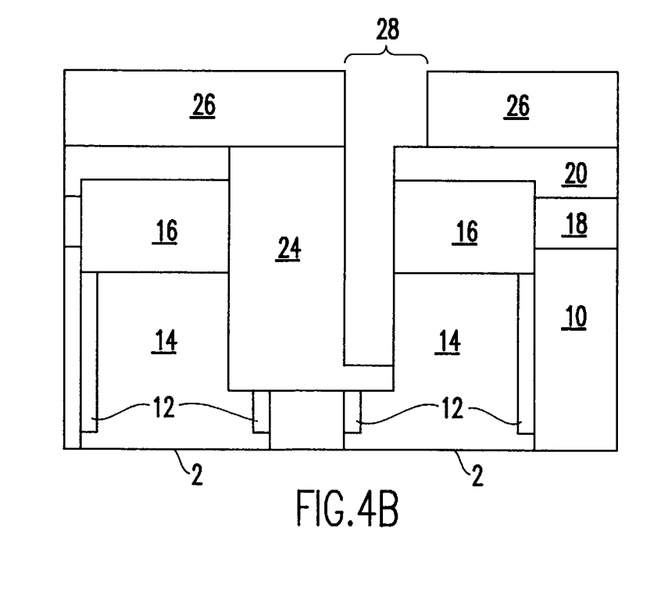
Figure 4C:
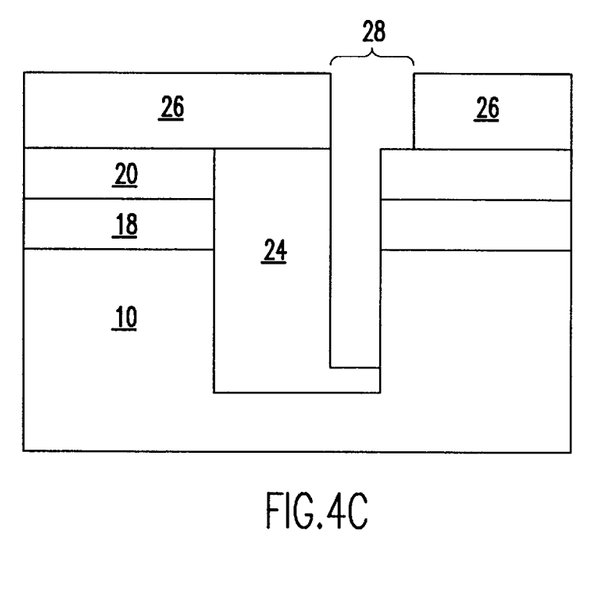

Next, as shown in FIGS. 4A, 4B, and 4C, the device is covered with a strap mask 26 and the oxide 24 is etched. Etching of oxide 24 is performed using etchants or procedures that are selective to nitride 20, such that recess 28 extends to the nitride 20 in one area, and further down into oxide 24 in another area. Because the nitride 20 blocks etching of the underlying materials, less demand on the openings in strap mask 26 are imposed.

Figure 5A:
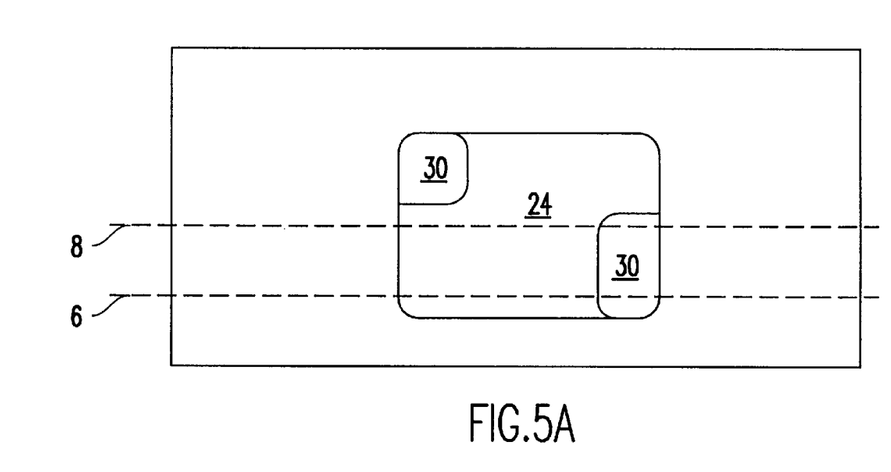
FIGS. 5A, 5B, and 5C are respectively a top view and two cross sectional views of the device shown in FIG. 4, following fill with doped polysilicon.
Figure 5B:
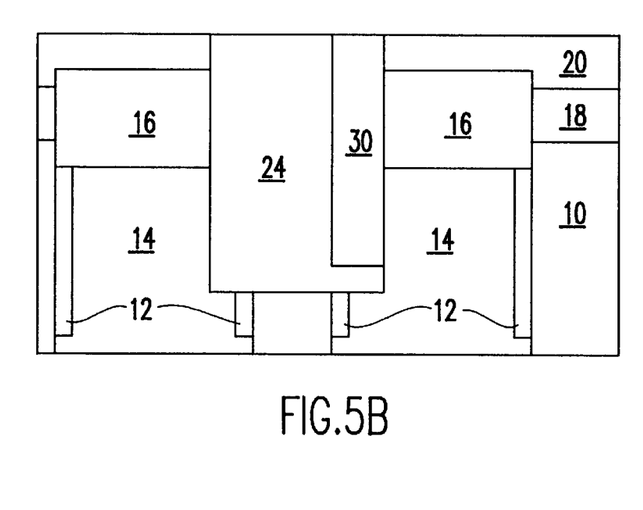
Figure 5C:
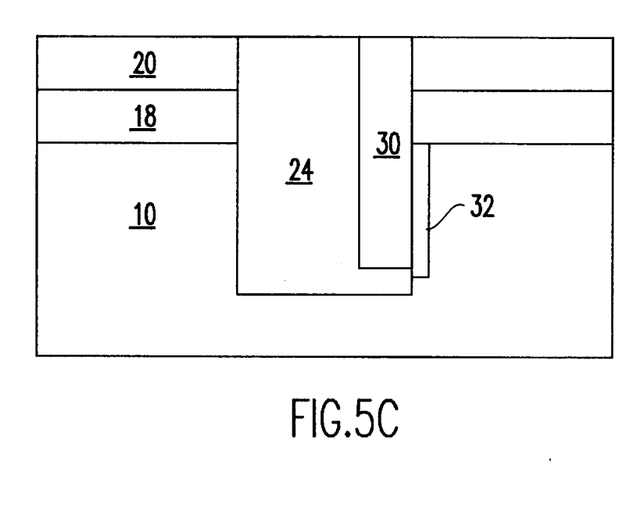

FIGS. 5A, 5B, and 5C show that following the oxide etch and removal of mask 26, the recess is filled with doped polysilicon 30. The dopant is preferably arsenic. Other dopants such as phosphorous and boron may be used. As a result of driving in the dopant, an outdiffusion 32 is formed in a region of silicon substrate 10. Outdiffusion 32 is a highly doped region in the lightly doped single crystal silicon substrate. The dopant also connects with the doped polysilicon fill inside the trench. The top surface of the doped polysilicon 30 is then polished.

Figure 6A:
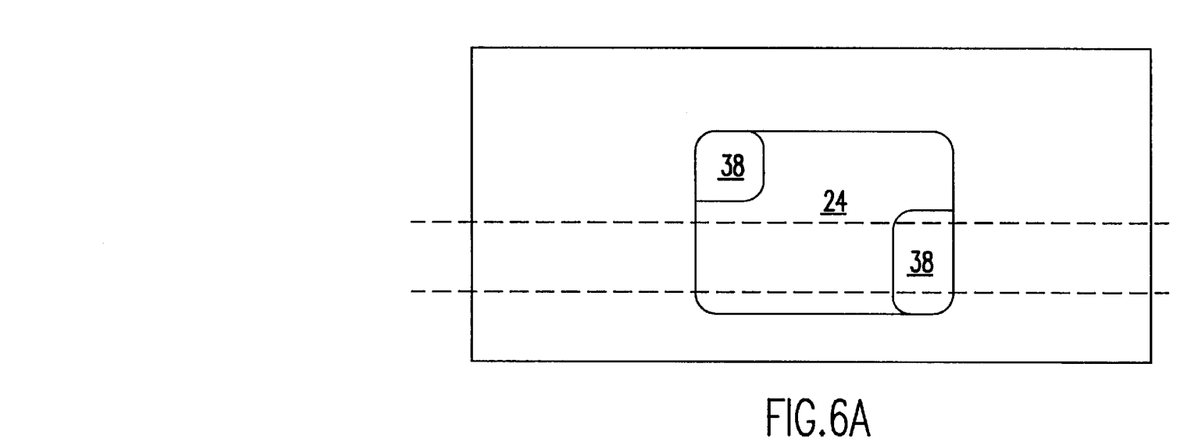
FIGS. 6A, 6B, and 6C are respectively a top view and two cross sectional views of the device shown in FIG. 5, following recess etch of doped polysilicon and quick oxidation.
Figure 6B:
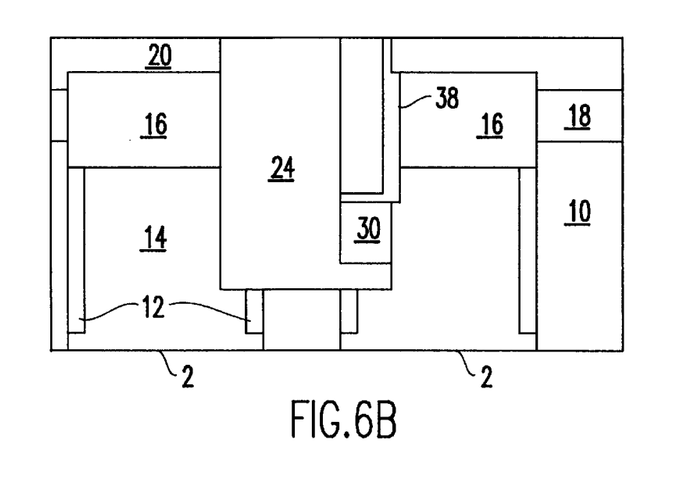
Figure 6C:
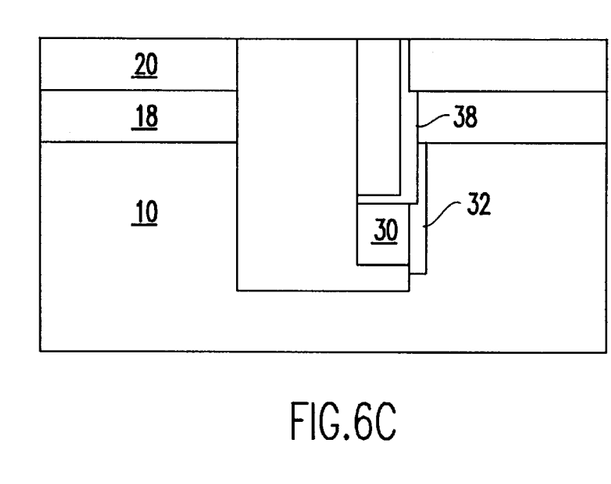

In the next step, shown in FIGS. 6A, 6B, and 6C, the doped polysilicon 30 is recess etched below the level of outdiffusion 32. The exposed polysilicon 30 and outdiffusion 32 are subjected to quick oxidation to remove any polysilicon residues. FIGS. 6B and 6C show this new oxidation 38.

Figure 7A:
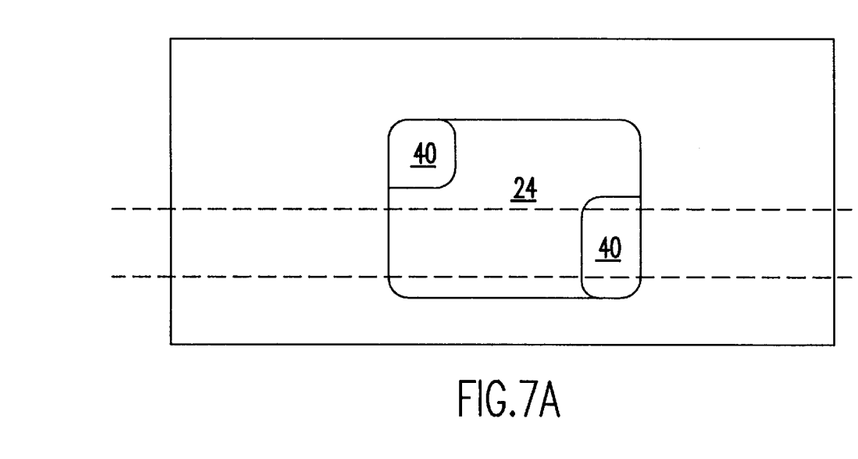
FIGS. 7A, 7B, and 7C are respectively a top view and two cross sectional views of the device shown in FIG. 6, at the completion of the inventive process.
Figure 7B:
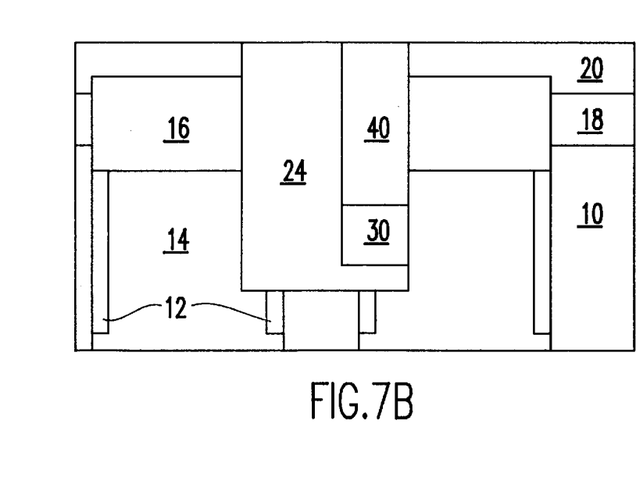
Figure 7C:
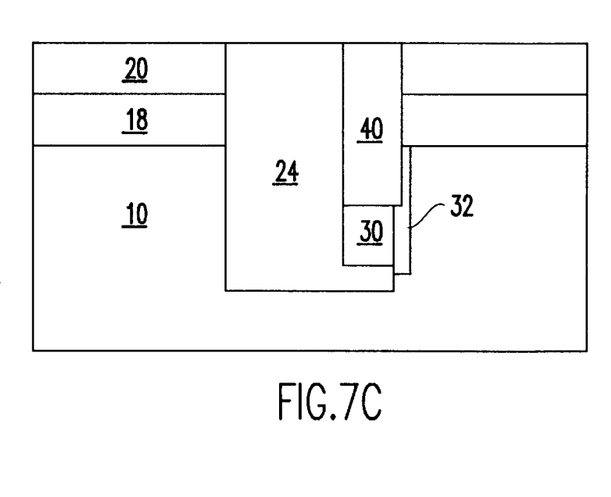

Finally, as shown in FIGS. 7A, 7B, and 7C this recess etch is filled with oxide 40 by chemical vapor deposition or other suitable means. As can be seen by FIGS. 7A, 7B, and 7C, the inventive method and structure provide for buried strap placement in integrated circuit chips with decreasing size requirements. The buried strap is formed by outdiffusion 32 and forms the backside of the array transfer device. This strap provides the connection between the inside of the storage trench and the backside of the array transfer device.

Figure 8:
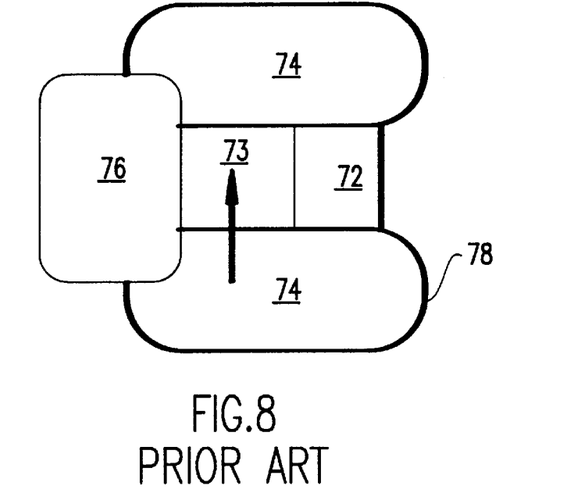
FIG. 8 is a top down view schematic showing the prior art method of surface strap formation bridging over the deep trench collar.

FIG. 8 shows a schematic top down view of the prior art placement of the surface strap. As can be seen the placement of the surface strap, as represented by arrow 70 is routed over the collar oxide 78, between deep trenches 74 and diffusion. Area 72 of the diffusion serves as the transfer gate region while area 73 of the diffusion is reserved for the surface strap. Isolation trench 76 is not used at all.

Figure 9:
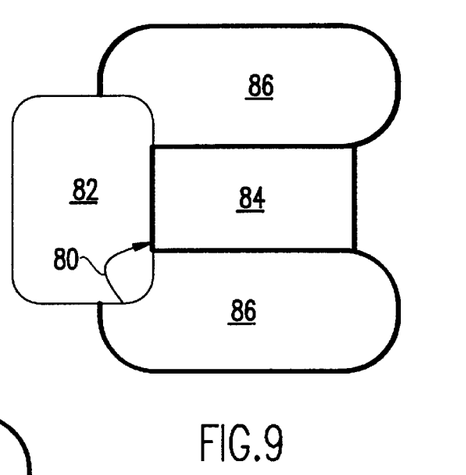
FIG. 9 is a top down view schematic showing the inventive structure bridging the deep trench collar through the isolation trench area.

The invention overcomes the problems of the prior art by using free area in the shallow trench isolation for a buried strap that shunts around the deep trench collar. As can be seen in FIG. 9, the routing of the buried strap as represented by arrow 80 is through the shallow trench isolation 82. Space in the transfer gate 84 between deep trenches 86 is not affected by the buried strap.

Figure 10:
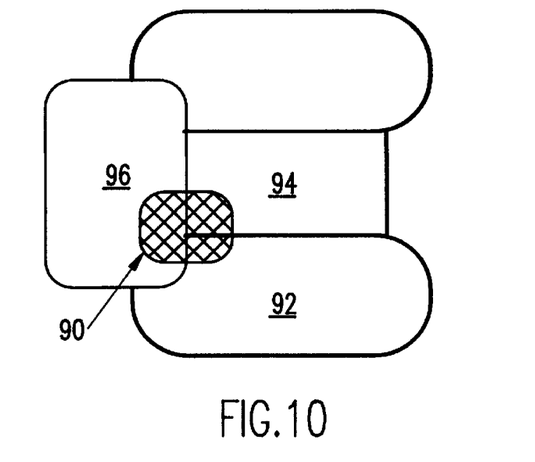
FIG. 10 is a top down view schematic showing the mask used to form the inventive structure.

In FIG. 10, there is shown the location of the photolithographic mask 90 which is used to etch the shallow trench isolation selective to nitride to provide for placement of the buried strap. Placement of the buried strap at this location allows the shallow trench isolation 96 to be used for more than one purpose.

While the invention has been described in terms of its preferred embodiments, those skilled in the art will recognize that the invention can be practiced with modification within the spirit and scope of the appended claims.

We claim:

1. A method for preparing a buried strap for trench storage capacitors in dynamic random access memory cells comprising the steps of:

providing a dynamic random access memory cell prepared with deep trenches;

cutting an isolation trench through a multiplicity of said deep trenches;

filling said isolation trench with oxide;

etching said isolation trench for a buried strap;

filling a strap recess with polysilicon containing a dopant; and forming an outdiffusion from said dopant.

2. A method as in claim 1 wherein said dopant is selected from the group consisting of arsenic, phosphorous, and boron.

3. A method as in claim 1 wherein said step of forming an outdiffusion is by driving in said dopant.

4. A method as in claim 3 wherein said step of driving in is by heating.

5. A method as in claim 1 wherein said step of cutting is through a multiplicity of collars in said multiplicity of deep trenches.

6. A method as in claim 1 wherein said etching is selective to nitride.

7. A trench storage capacitor comprising:

a deep trench formed in a silicon substrate;

an isolation trench positioned adjacent said deep trench;

a transfer gate positioned adjacent said deep trench and adjacent said isolation trench; and a buried strap extending through said isolation trench to connect said deep trench with said transfer gate.

8. A trench storage capacitor as in claim 7, wherein said isolation trench is filled with oxide.

9. A trench storage capacitor as in claim 7, wherein said deep trench is filled with polysilicon.

10. A trench storage capacitor as in claim 7, wherein said buried strap includes an outdiffusion of said silicon substrate.

\* \* \* \* \*